United States Patent [19]
Kraus

[11] Patent Number: 5,173,574
[45] Date of Patent: Dec. 22, 1992

[54] SOLDERING CONNECTOR AND METHOD FOR MANUFACTURING AN ELECTRIC CIRCUIT WITH THIS SOLDERING CONNECTOR

[75] Inventor: Heinz Kraus, Traunreut, Fed. Rep. of Germany

[73] Assignee: Johannes Heidenhain GmbH, Traunreut, Fed. Rep. of Germany

[21] Appl. No.: 720,912

[22] Filed: Jun. 25, 1991

[30] Foreign Application Priority Data

Jun. 30, 1990 [EP] European Pat. Off. ........ 90112537.7

[51] Int. Cl.⁵ .................. H05K 1/00; H05K 3/34
[52] U.S. Cl. ..................... 174/261; 29/840; 174/52.4; 257/70; 257/775; 257/776; 361/409
[58] Field of Search ............... 357/80, 70; 228/180.2; 174/261, 52.4; 29/840; 361/421, 409; 428/901

[56] References Cited

U.S. PATENT DOCUMENTS

| | | |
|---|---|---|
| 3,374,537 | 3/1968 | Doelp, Jr. .................. 361/421 X |
| 3,668,770 | 6/1972 | Husni .................. 228/180.2 X |
| 3,780,432 | 12/1973 | Baas .................. 174/261 X |
| 3,969,684 | 9/1969 | Keady et al. .................. 361/421 X |
| 4,048,438 | 9/1977 | Zimmerman .................. 358/80 X |
| 4,234,666 | 11/1980 | Gursky .................. 174/52.4 X |
| 4,413,404 | 11/1983 | Burns . |
| 4,609,892 | 9/1986 | Higgins, Jr. .................. 361/421 X |
| 4,611,262 | 9/1986 | Galloway et al. .................. 428/901 X |

FOREIGN PATENT DOCUMENTS

| | | |
|---|---|---|
| 0303808 | 2/1989 | European Pat. Off. . |
| 1490080 | 6/1969 | Fed. Rep. of Germany . |
| 62-165348 | 7/1987 | Japan . |
| 64-42825 | 8/1987 | Japan . |
| 62-211940 | 9/1987 | Japan . |
| 2175149 | 11/1986 | United Kingdom . |

OTHER PUBLICATIONS

IBM Tech Discl Bull vol. 9, No. 6, Nov. 1966 by W. R. Arnold et al, pp. 565-566.

*Primary Examiner*—Carl J. Arbes
*Attorney, Agent, or Firm*—Anderson Kill Olick & Oshinsky

[57] ABSTRACT

A soldering connector and a method for manufacturing an electric circuit with this soldering connector. The soldering connector serves to bridge several contact surfaces. The soldering connector includes several soldering jumpers which include a common support and are of an electrically conductive material and are formed in a single piece with the support and are constructed in a cantilevering manner. Predetermined breaking points are provided between the support and the soldering jumpers, so that the common support can be severed after the soldering procedure by simply tearing it off from the soldering jumper.

20 Claims, 4 Drawing Sheets

SOLDERING CONNECTOR AND METHOD FOR MANUFACTURING AN ELECTRIC CIRCUIT WITH THIS SOLDERING CONNECTOR

BACKGROUND OF THE INVENTION

1. Field of the Invention

The present invention relates to a soldering connector for an electric circuit with several soldering jumpers or solder straps which include a common support.

The present invention further relates to a method for manufacturing an electric circuit with this soldering connector with a substrate on which are placed a printed circuit and electrical components, wherein soldering jumpers are mounted between contact surfaces of electrical components and/or contact surfaces of the printed circuit.

2. Description of the Related Art

The method of wire contacting in electrical components is frequently used in the field of microelectronics. In wire contacting, each wire is individually pulled from a contact surface of the electrical component to a contact surface of a substrate. Thus, fine welding connections are produced with the use of thin wires, usually of gold or aluminum and having a diameter of 25 μm and with the use of pressure, temperature or ultrasonics.

The above-described wire contacting makes possible an automatable and economical manufacturing process, however, the electric connections produced by this method are not particularly stable. Therefore, for reasons of stability, contacting using soldering technology exclusively is frequently preferred over wire contacting. When using the soldering technology, the soldering jumper is formed by a stable copper wire which is soldered to the contact surfaces by means of a soldering iron. This procedure is very time-consuming when several contact surfaces of electrical components are to be connected to each other or to contact surfaces of the substrate. Also, manual soldering may easily lead to unsatisfactory contact points.

EP-A 0 303 808 discloses a soldering connector in which several copper wires serving as soldering jumpers are embedded spaced apart from each other in a common flexible foil. By placing the soldering connector on the substrate, several contact points are bridged without much difficulty. The soldering jumpers can be of stable construction. The disadvantage of this known soldering connector is the cumbersome manufacture of the hybrid structure consisting of the insulated support and the soldering jumpers.

SUMMARY OF THE INVENTION

Therefore, it is the object of the present invention to provide a soldering connector in which several soldering jumpers are integrated and which can be constructed simply and inexpensively.

In accordance with the present invention, the support of the soldering connector is composed with the soldering jumpers of an electrically conductive material and is constructed with the soldering jumpers in one piece and in a cantilevering manner, and each soldering jumper includes at least one predetermined breaking point.

It is another object of the present invention to provide a method which makes it possible with simple means to bridge several contact surfaces of electrical components with each other with contact surfaces of a substrate. The soldering jumpers should be of simple construction and they should not require a substantial amount of space, while still ensuring a secure and stable electric connection.

In accordance with the present invention, this further object is met by the steps of placing the printed circuit and the electrical components on the substrate, such that several contact surfaces are created which are spaced apart from each other and are to be connected electrically to each other, and placing a soldering connection on the substrate, so that each soldering jumper bridges at least two contact surfaces, wherein the soldering connector is composed of several soldering jumpers which include a common support and wherein the soldering jumpers are constructed with the support of an electrically conductive material and are constructed in one piece with the support and in a cantilevering manner, soldering the soldering jumpers to the contact surfaces, and removing the common support by severing predetermined breaking points provided between the support and the soldering jumpers.

The particular advantage provided by the present invention resides in the fact that the soldering connector can be manufactured inexpensively because a cumbersome hybrid structure is not required. The soldering procedure can be performed for several soldering points simultaneously in a continuous-heating furnace. Since no manual soldering takes place, aggressive fluxing materials are unnecessary and, therefore, a subsequent cleaning of plates with solvents is also unnecessary. The locations of the soldering jumpers are exactly determined and the randomness of manual soldering with the attendant risks is eliminated. Because of the flat construction of the soldering jumpers and the good positive engagement of the solder, the soldering points are significantly less sensitive to shock and vibration than are those of the prior art.

The various features of novelty which characterize the invention are pointed out with particularity in the claims annexed to and forming a part of this disclosure. For a better understanding of the invention, its operating advantages attained by its use, reference should be had to the drawing and descriptive matter in which there are illustrated and described preferred embodiments of the invention.

DESCRIPTION OF THE PREFERRED EMBODIMENTS

Figure 1:
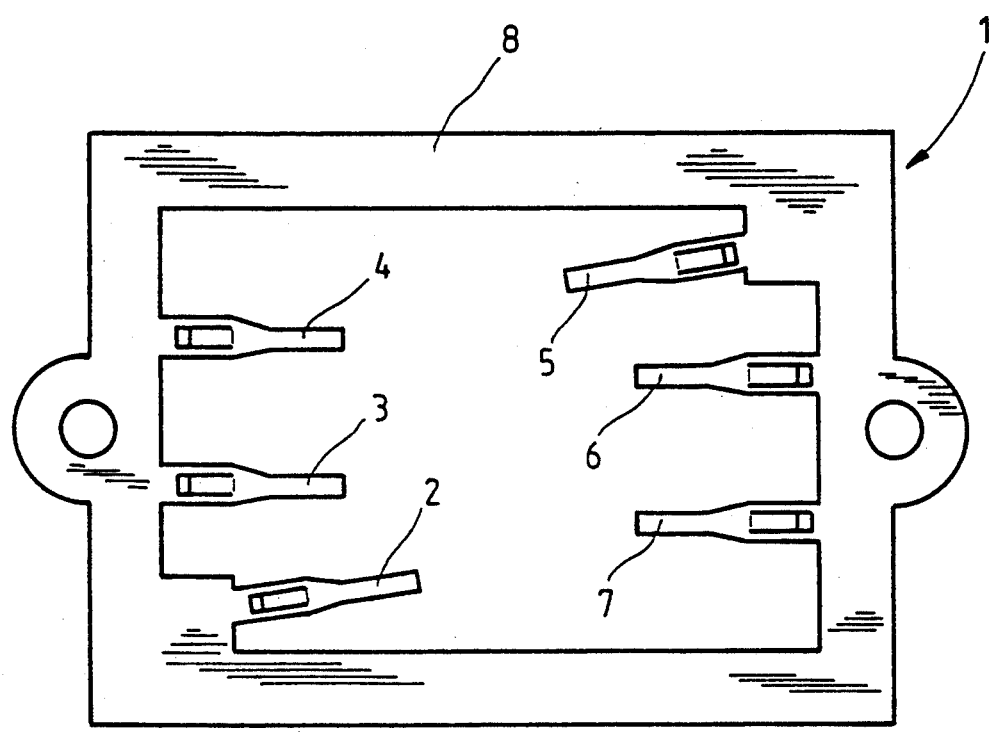
FIG. 1 a schematic front view of a soldering connector according to the present invention.

FIG. 1 of the drawing schematically shows in a plan view a soldering connector 1. The soldering connector 1 includes several soldering jumpers or solder straps 2, 3, 4, 5, 6 and 7 and a common circumferentially extending support 8. The support 8 with the soldering jumpers 2-7 is made of electrically conductive material, preferably copper, and is constructed in one piece and in a freely cantilevering manner. The width of each soldering jumper 2-7 is approximately 0.5 mm, so that the galvanoplastic method can be used for manufacturing the freely cantilevering microstructures.

Figure 2:
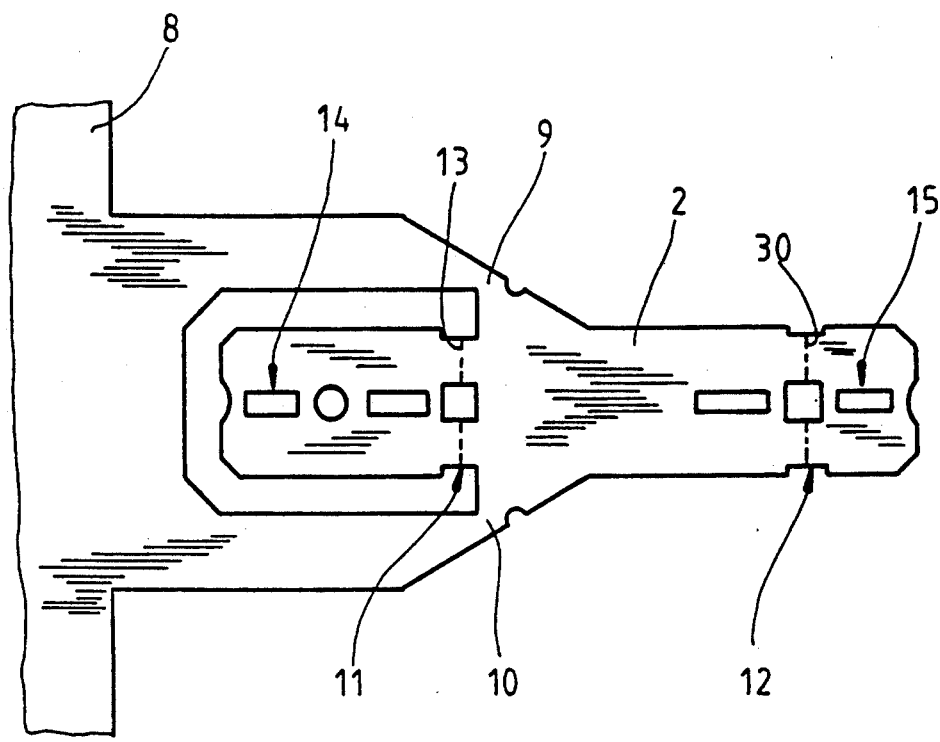
FIG. 2 is a schematic view, on a larger scale, of a soldering jumper of the soldering connector of FIG. 1.

An advantageous configuration of the soldering jumpers 2-7 is illustrated in FIG. 2. The soldering jumper 2 shown in FIG. 2 is connected to the support 8 through predetermined breaking points 9, 10 are provided so that the support 8 can be severed after the soldering procedure from the soldering jumper 2 by tearing. The soldering jumper 2 has transversely extending perforations 11, 12 which predetermine the positions of bending edges 13, 30. As a result, the requirements with respect to precision and the costs of the bending tools can be significantly reduced. In addition, it is very simple to realize bendings and crimpings which may be required for adjusting the vertical position of the soldering bridge 2.

The ends of the soldering jumper 2 also include perforations 14, 15 which ensure that the solder is received well and that the solder flows through in order to obtain positive engagement. The perforations 14, 15 advantageously extend in longitudinal direction of the soldering jumper 2. The slot-like configuration of the perforations 14, 15 produces a capillary effect, so that excessive solder and fluxing material flows off due to surface tension from the soldering points along the perforations 14, 15.

Figure 3:
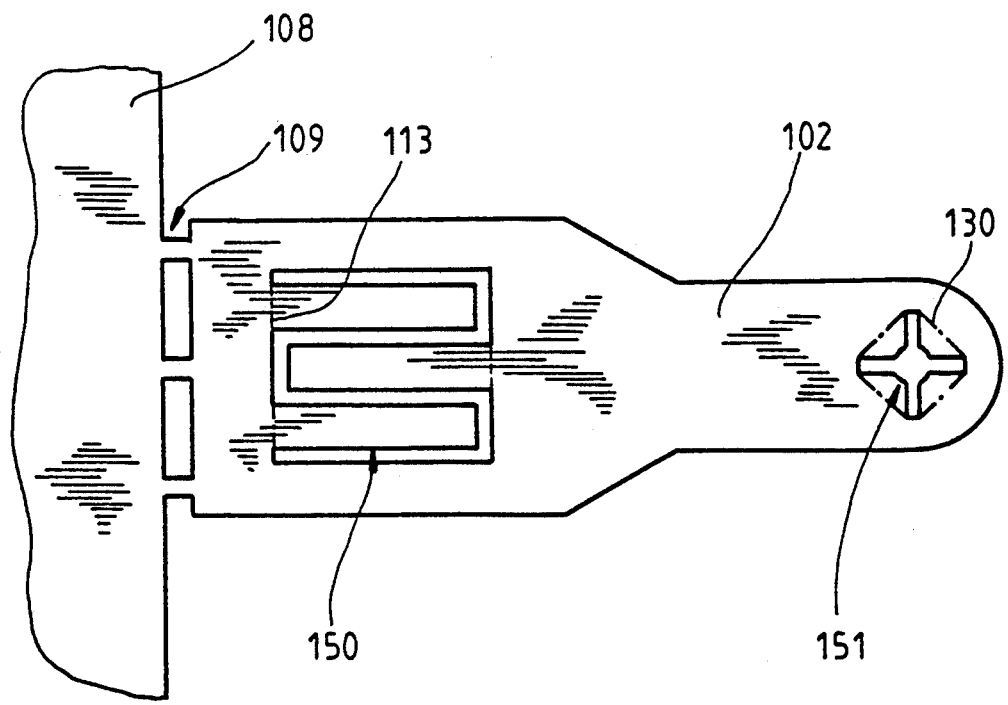
FIG. 3 is a schematic view, also on a larger scale, of another embodiment of a soldering jumper.

FIG. 3 shows another enlarged illustration of a soldering jumper 102. In this embodiment, the predetermined breaking point 109 is provided directly at the inner edge of the support 108. Transversely extending perforations serving as bending edges are not required in this embodiment. The lugs 150, 151 are bent in order to adjust the vertical position. The lugs 150, 151 ensure that during the soldering procedure the solder flows through in order to obtain positive engagement of the solder with the soldering jumper 102. The bending edges 113, 130 resulting from the bending procedure are shown in dash-dot lines.

The soldering jumpers 2 and 102 shown in detail in the drawing each have only two soldering points. If necessary, several soldering points can be provided on each soldering jumper. This feature is not illustrated in the drawing.

Figure 4:
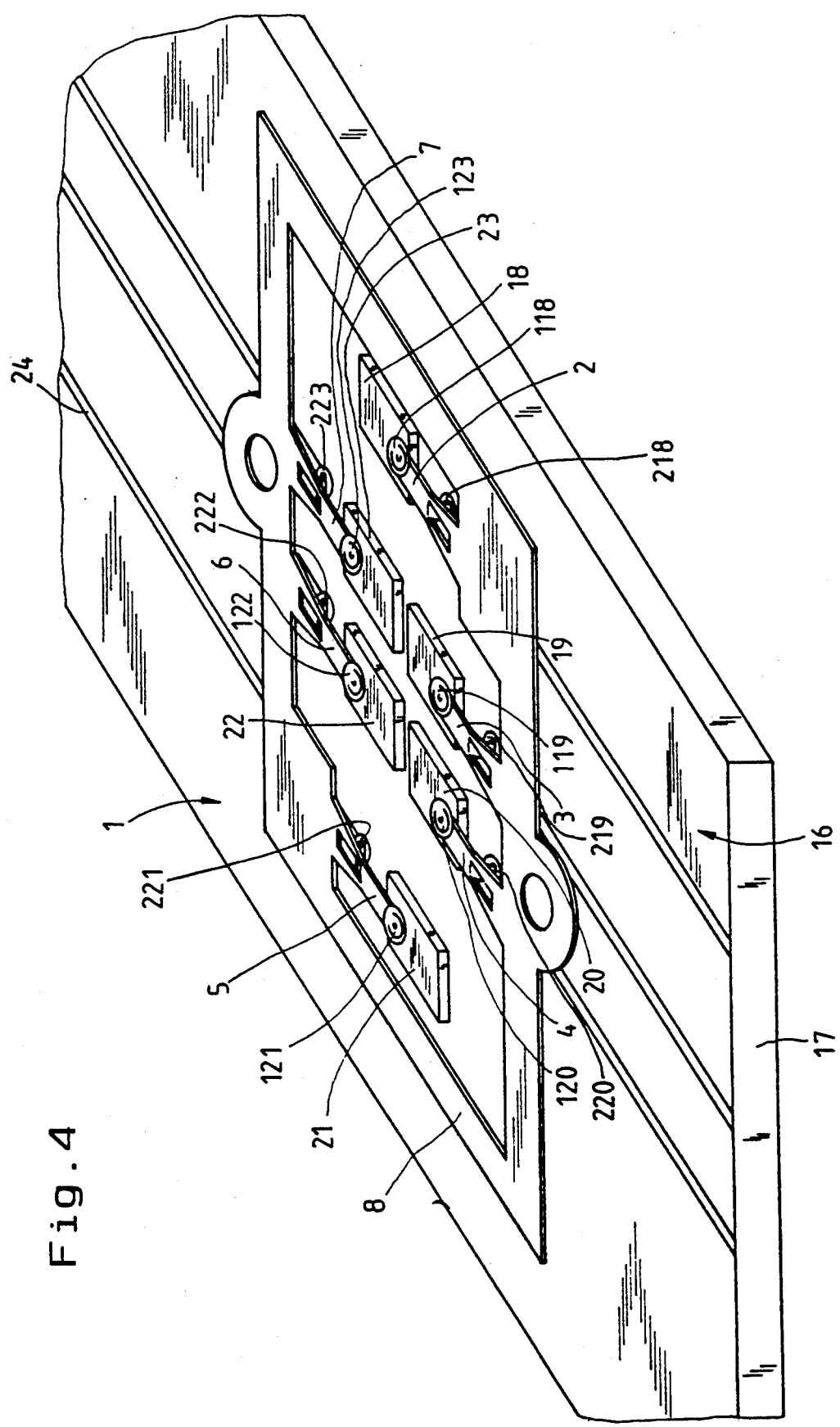
FIG. 4 is a perspective view of an electric circuit with soldering connector.
Figure 5:
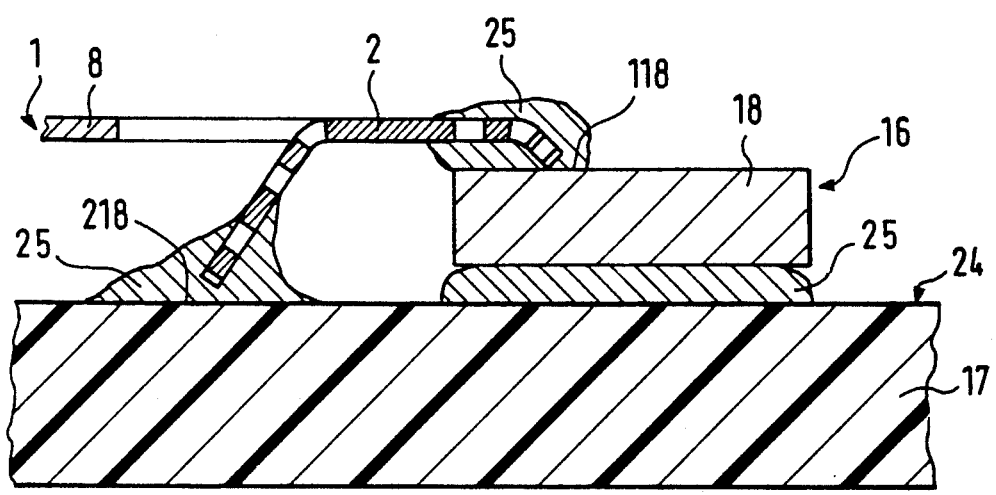
FIG. 5 is a cross-sectional view of a soldering jumper of the soldering connector of FIG. 4.

In order to explain in more detail the method for manufacturing an electric circuit 16 with a soldering connector 1 constructed according to the present invention, FIGS. 4 and 5 of the drawing show an equipped printed circuit board 17. The printed circuit board 17, also called substrate, is a component of a scanning unit of an incremental photoelectric position measuring device. In such position measuring devices, surface-mounted electrical components are increasingly used for equipping printed circuit boards 17. The components for scanning a scale are opto-electronic semiconductor components in the form of silicon photo- elements 18, 19, 20, 21, 22 and 23.

For clarity's sake, FIG. 4 only shows the photoelements 18-23. Of course, additional electrical components are provided on the printed circuit board 17.

The metallized rear sides of the photoelements 18-23 are connected to the printed circuit board 17 in an electrically conductive manner. In order to obtain this connection, the first step is placing a printed circuit 24 on the substrate 17. A soldering paste 25 is placed on the resulting printed circuit board 17. The soldering paste 25 serves as a conductive intermediate layer at those locations where the photoelements 18-23 are to be positioned. After placing the photoelements 18-23 either manually or by means of an automatic mounting unit, soldering paste 25 is applied on the contact surfaces 118, 119, 120, 121, 122 and 123 on the upper sides of the photoelements 18-23. During the same method step, soldering paste 25 can also be applied to the contact surfaces 218, 219, 220, 221, 222 and 223.

The prebent soldering connector is now placed on the printed circuit board 17 in such a way that each soldering jumper 2-7 bridges a contact surface 118 through 123 each of a photoelement 18-23 and a contact surface 218-223 of the printed circuit 24. After placing and positioning the soldering connector 1, soldering is carried out, preferably reflow soldering in an infrared furnace. The mechanical strength of the soldered connections produced in this manner is a high and the photoelements 18-23 are subjected to equally high temperatures during reflow soldering. Moreover, an automatic fine positioning of the photoelements 18-23 and of the soldering connector 1 is obtained by surface tension effects.

After the soldering procedure, the common support 8 is removed, so that of the soldering connector 1 there remain on the spring circuit board 17 only the individual soldering jumpers 2-7. The predetermined breaking points 9, 10 between the common support 8 and the individual soldering jumpers 2-7 make it possible that the support 8 can be simply pulled and torn from the soldering jumpers 2-7 without causing damage to the soldering jumpers 2-7.

It is also possible to manufacture different electric circuits by means of the soldering connector 1 according to the present invention. Furthermore, the electrical components do not have to be photoelements 18-23. Rather, the contact surfaces of other components can be bridged with contact surfaces of a printed circuit. Also, contact surfaces of several electrical components can be electrically connected and bridged by means of the soldering connector either with each other or with contact surfaces of a printed circuit.

While specific embodiments of the invention have been shown and described in detail to illustrate the inventive principles, it will be understood that the invention may be embodied otherwise without departing from such principles.

I claim:

1. A soldering connector which comprises:
   at least one soldering jumper wherein each of said soldering jumpers further comprises a plurality of regions spaced apart from one another and along said soldering jumper wherein said regions are utilized for a soldering operation; and
   a common holder wherein each of said soldering jumpers is connected to said common holder through a breakpoint region which is pre-determined and further wherein said common holder and said soldering jumpers constitute a single unit of electrically conducting material and forms a cantilever and further wherein said common holder is detachable from said soldering jumpers at the said break-point regions subsequent to the completion of a common soldering operation.

2. The soldering connector of claim 1, wherein each soldering jumper is soldered at at least one of its spaced apart regions to a surface of a component which is installed on the surface of a printed circuit board and further wherein said soldering jumper is soldered at at least one of its spaced apart regions to a printed circuit board which supports said component.

3. The soldering connector of claim 2, wherein said soldering jumpers further comprise level equalizing bends which extend along transversely running perforations.

4. The soldering connector of claim 3, wherein said soldering jumper further comprises perforations at said spaced apart regions which are soldered wherein said perforations run along said soldering jumper.

5. The soldering connector of claim 1, wherein said soldering jumper further comprises perforations at said spaced apart regions which are soldered wherein said perforations run along said soldering jumper.

6. The soldering connector of claim 2, wherein said soldering jumper further comprises perforations at said spaced apart regions which are soldered wherein said perforations run along said soldering jumper.

7. The soldering connector of claim 1, wherein said soldering jumpers further comprise level equalizing bends which extend along transversely running perforations.

8. The soldering connector of claim 7, wherein said soldering jumper further comprises perforations at said spaced apart regions which are soldered wherein said perforations run along said soldering jumper.

9. A soldering connector which comprises:
at least one soldering jumper wherein each of said soldering jumpers further comprises a plurality of regions spaced apart from one another and along said soldering jumper wherein said regions are utilized for a soldering operation; and
a common holder wherein each of said soldering jumpers is connected to said common holder through a breakpoint region which is pre-determined and further wherein said common holder and said soldering jumpers constitute a single unit of electrically conducting material and forms a cantilever and further wherein said regions of said soldering jumpers are electrically connected to connection locations of an electrical circuit by a common soldering operation.

10. The soldering connector of claim 9, wherein each soldering jumper is soldered at at least one of its spaced apart regions to a surface of a component which is installed on the surface of a printed circuit board and further wherein said soldering jumper is soldered at at least one of its spaced apart regions to a printed circuit board which supports said component.

11. The soldering connector of claim 9, wherein said soldering jumpers further comprise level equalizing bends which extend along transversely running perforations.

12. The soldering connector of claim 10, wherein said soldering jumpers further comprise level equalizing bends which extend along transversely running perforations.

13. The soldering connector of claim 9, wherein said soldering jumper further comprises perforations at said spaced apart regions which are soldered wherein said perforations run along said soldering jumper.

14. The soldering connector of claim 10, wherein said soldering jumper further comprises perforations at said spaced apart regions which are soldered wherein said perforations run along said soldering jumper.

15. The soldering connector of claim 11, wherein said soldering jumper further comprises perforations at said spaced apart regions which are soldered wherein said perforations run along said soldering jumper.

16. The soldering connector of claim 12, wherein said soldering jumper further comprises perforations at said spaced apart regions which are soldered wherein said perforations run along said soldering jumper.

17. In a method for manufacturing an electric circuit with a substrate on which are placed a printed circuit and electrical components, wherein soldering jumpers are mounted between contact surfaces of the electrical components and/or contact surfaces of the printed circuit, the improvement comprising the steps of
a) placing the printed circuit and the electrical components on the substrate, so that several contact surfaces are formed which are spaced apart from each other and are to be connected electrically to each other;
b) placing a soldering connector on the substrate, such that each soldering jumper bridges at least two contact surfaces, wherein the soldering connector is composed of several soldering jumpers which include a common support and wherein the soldering jumpers and the support are constructed of an electrically conductive material and the soldering jumpers are constructed in one piece with the support and in a cantilevering manner;
c) soldering the soldering jumpers to the contact surfaces; and
d) removing the common support by severing predetermined breaking points provided between the support and the soldering jumpers.

18. The method according to claim 17, wherein the removal of the common support is effected by tearing off.

19. The method according to claim 17, comprising applying soldering paste to the contact surfaces before the soldering connector is placed on the substrate, and carrying out the soldering step by reflow soldering.

20. The method according to claim 17, wherein the electric circuit is component part of a photoelectric position-measuring device, wherein the electrical components are photoelements, further comprising electrically connecting by means of the soldering connector contact surfaces of the photoelements which face upwardly with contact surfaces of the printed circuit.

* * * * *

UNITED STATES PATENT AND TRADEMARK OFFICE
CERTIFICATE OF CORRECTION

PATENT NO. : 5,173,574
DATED : December 22, 1992
INVENTOR(S) : Heinz Kraus

It is certified that error appears in the above-indentified patent and that said Letters Patent is hereby corrected as shown below:

On the title page, Item [73] Assignee: should read:

--Dr. Johannes Heidenhain, GmbH Traunreut, Fed. Rep. of Germany

Signed and Sealed this

Twenty-third Day of November, 1993

Attest:

BRUCE LEHMAN

Attesting Officer

Commissioner of Patents and Trademarks